US008866023B2

(12) United States Patent
Kadri et al.

(10) Patent No.: US 8,866,023 B2
(45) Date of Patent: Oct. 21, 2014

(54) METHOD AND SYSTEM FOR REDUCING TRACE LENGTH AND CAPACITANCE IN A LARGE MEMORY FOOTPRINT

(75) Inventors: Rachid M. Kadri, Houston, TX (US); Stephen F. Contreras, Spring, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 274 days.

(21) Appl. No.: 13/265,323

(22) PCT Filed: Apr. 17, 2009

(86) PCT No.: PCT/US2009/040997

§ 371 (c)(1), (2), (4) Date: Oct. 19, 2011

(87) PCT Pub. No.: WO2010/120310

PCT Pub. Date: Oct. 21, 2010

(65) Prior Publication Data

US 2012/0175160 A1 Jul. 12, 2012

(51) Int. Cl.

| | |
|---|---|
| ***H05K 1/11*** | (2006.01) |
| ***H05K 1/18*** | (2006.01) |
| ***G11C 5/06*** | (2006.01) |
| *H05K 1/14* | (2006.01) |
| *H05K 1/02* | (2006.01) |

(52) U.S. Cl.

CPC *H05K 1/181* (2013.01); *H05K 1/14* (2013.01); *H05K 2201/10545* (2013.01); *H05K 2201/044* (2013.01); *H05K 1/0237* (2013.01); *H05K 1/114* (2013.01); *G11C 5/066* (2013.01); *H05K 2201/10189* (2013.01); *H05K 2201/09227* (2013.01)

USPC .......................................... 174/261; 361/784

(58) Field of Classification Search

CPC ..... G11C 5/066; H05K 1/0237; H05K 1/114; H05K 1/14; H05K 1/181; H05K 2201/044; H05K 2201/09227; H05K 2201/10189; H05K 2201/10545

USPC .......... 361/748, 764, 784; 174/261, 253, 260; 439/83, 876, 247, 248, 76.1, 327; 29/832, 841, 842, 854

See application file for complete search history.

(56) References Cited

U.S. PATENT DOCUMENTS

| | | | |
|---|---|---|---|
| 6,246,588 | B1 | 6/2001 | Kim et al. |
| 6,443,745 | B1 | 9/2002 | Ellis et al. |

(Continued)

FOREIGN PATENT DOCUMENTS

| | | |
|---|---|---|
| CN | 1926632 | 3/2007 |

OTHER PUBLICATIONS

Patent Cooperation Treaty, International Search Report and Written Opinion, mailed Apr. 26, 2010 for International Application No. PCT/US2009/040997,12 pgs.

*Primary Examiner* — Yuriy Semenenko

(57) ABSTRACT

A method and system are disclosed to reduce trace length and capacitance in a large memory footprint. When more dual in-line memory module (DIMM) connectors are used per memory channel, the overall bus bandwidth may be affected by trace length and trace capacitance. In order to reduce the overall trace length and trace capacitance, the system and method use a palm tree topology placement, i.e., back-to-back DIMM placement, to place surface mount technology (SMT) DIMM connectors (instead of through-hole connectors) back-to-back in a mirror fashion on each side of a printed circuit board (PCB). The system and method may improve signal propagation time when compared to the commonly used traditional topology placements in which all DIMM connectors are placed on one side of the PCB.

10 Claims, 4 Drawing Sheets

(56) References Cited

U.S. PATENT DOCUMENTS

| | | | | |
|---|---|---|---|---|
| 6,545,875 | B1 * | 4/2003 | Perino et al. | 361/760 |
| 6,817,870 | B1 | 11/2004 | Kwong et al. | |
| 6,927,992 | B1 | 8/2005 | Yen | |
| 7,440,289 | B2 * | 10/2008 | Sugano et al. | 361/760 |
| 7,488,192 | B1 * | 2/2009 | Eagle et al. | 439/159 |
| 2002/0041020 | A1 * | 4/2002 | Ono et al. | 257/685 |
| 2004/0149490 | A1 | 8/2004 | Chang et al. | |
| 2005/0195629 | A1 * | 9/2005 | Leddige et al. | 365/51 |
| 2008/0123303 | A1 * | 5/2008 | Sugano et al. | 361/728 |

* cited by examiner

METHOD AND SYSTEM FOR REDUCING TRACE LENGTH AND CAPACITANCE IN A LARGE MEMORY FOOTPRINT

The current printed circuit board (PCB) technology may use several different types of topology placements for placing dual in-line memory module (DIMM) connectors. It is desirable to maximize the number of DIMM connectors per memory channel for high memory capacity while operating at the highest possible frequency that the memory channel can support. One solution is to place all of the DIMM connectors close to the multi-core socket to keep trace lengths as short as possible. However, as more and more DIMM connectors are supported for higher memory capacity, the signal trace connecting the DIMM connectors is lengthened in a traditional topology. For example, with the double-data-rate two (DDR2) memory technology, four DIMM connectors per memory channel routed in the traditional topology may give marginal results at 667 MHZ.

Moreover, using through-hole DIMM connectors and placing the through-hole DIMM connectors on one side of the PCB only, the group of DIMM connectors that are farther from the multi-core socket will set the speed at which the memory bus can operate. Therefore, a heavily loaded bus populated with the maximum number of DIMM connectors may bring lower speeds because of the capacitance effect of long traces that affects timing parameters.

SUMMARY

An embodiment of a printed circuit board (PCB) assembly includes a PCB having a top side and a bottom side, a first surface mount technology (SMT) dual in-line memory module (DIMM) connector placed on the top side of the PCB, and a second SMT DIMM connector placed on the bottom side of the PCB. The second SMT DIMM connector shares at least one via with the first SMT DIMM connector.

An embodiment of a method for reducing trace length and capacitance in a large memory footprint includes placing a first surface mount technology (SMT) dual in-line memory module (DIMM) connector on a top side of a printed circuit board (PCB), placing a second SMT DIMM connector on a bottom side of the PCB, and allowing the second SMT DIMM connector to share at least one via with the first SMT DIMM connector.

An embodiment of a system for reducing trace length and capacitance in a large memory footprint includes means for placing a first surface mount technology (SMT) dual in-line memory module (DIMM) connector on a top side of a printed circuit board (PCB), means for placing a second SMT DIMM connector on a bottom side of the PCB, and means for allowing the second SMT DIMM connector to share at least one via with the first SMT DIMM connector.

BRIEF DESCRIPTION OF THE DRAWINGS

Exemplary embodiments of the method and system for reducing trace length and capacitance in a large memory footprint will be described in detail with reference to the following figures, in which like numerals refer to like elements, and wherein.

DETAILED DESCRIPTION

A system and method for reducing trace length and capacitance in a large memory footprint is described. As noted above, it is desirable to maximize the number of dual in-line memory module (DIMM) connectors for each memory channel while operating at the highest possible frequency that the memory channel can support. When more DIMM connectors are used per memory channel, the overall bus bandwidth may be affected by trace length and trace capacitance. In order to reduce the overall trace length and trace capacitance, the system and method use a palm tree topology placement, i.e., back-to-back DIMM placement, to place surface mount technology (SMT) DIMM connectors (instead of through-hole connectors) back-to-back in a mirror fashion on each side of a printed circuit board (PCB). The system and method may improve signal propagation time when compared to the traditional topology placements, such as the daisy chain, Tee, and Star topology placements, in which all DIMM connectors (or through-hole DIMM sockets) are placed on one side of the PCB.

Figure 1:
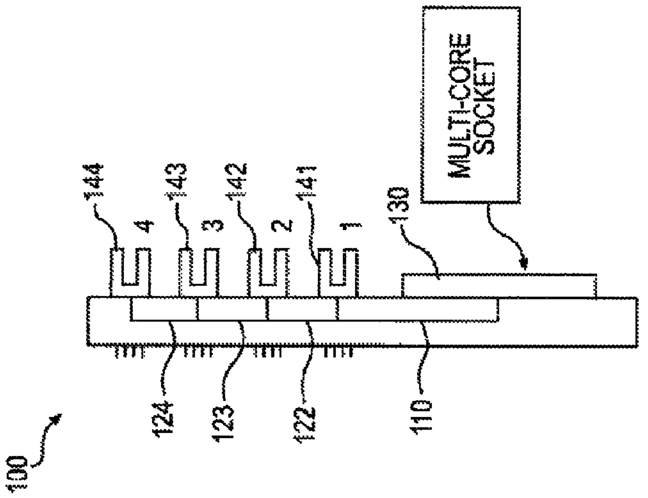
FIGS. 1, 2, and 3 illustrate exemplary daisy chain, Tee, and Star topology placements, respectively, which are traditional topology placements for placing dual in-line memory module (DIMM) connectors.

FIG. 1 illustrates an exemplary daisy chain topology 100 placement. For each memory channel, the daisy chain topology 100 provides a trace routing, i.e., connection 110, from a multi-core socket 130 to $DIMM_1$ 141, a connection 122 from $DIMM_1$ 141 to $DIMM_2$ 142, a connection 123 from $DIMM_2$ 142 to $DIMM_3$ 143, and a connection 124 from $DIMM_3$ 143 to $DIMM_4$ 144.

Figure 2:
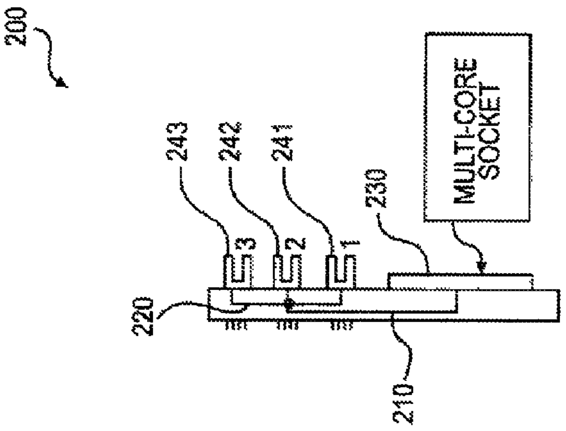

FIG. 2 illustrates an exemplary Tee topology 200 placement. For each memory channel, the Tee topology 200 requires at least two layers of connections: one layer for the connection 210 from a multi-core socket 230 to $DIMM_2$ 242, and a second layer for the connection 220 from $DIMM_2$ 242 to $DIMM_1$ 241 and $DIMM_3$ 243.

Figure 3:
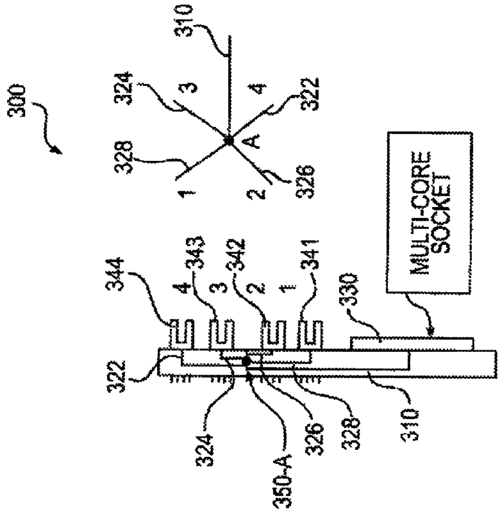

FIG. 3 illustrates an exemplary Star topology 300 placement. For each memory channel, the Star topology 300 requires at least three layers of connections: one layer for the connection 310 from a multi-core socket 330 to a common via A 350, a second layer for the connection 322 from the common via A 350 to $DIMM_4$ 344, and for the connection 328 from the common via A 350 to $DIMM_1$ 341, and a third layer for the connection 326 from the common via A 350 to $DIMM_2$ 342 and for the connection 324 from the common via A 350 to $DIMM_3$ 343. A connection 322, 324, 326, and 328 from the common via A 350 to each one of the four DIMM connectors 344, 343, 342, and 341 is equal in length.

The Tee and Star topology placements can improve signal propagation time and the bandwidth compared to the daisy chain topology because the Tee and Star topology placements are capable of keeping trace lengths short and balanced to each DIMM connector. However, the Tee and Star topology placements require more layers and vias to make connections to the group of DIMM connectors associated to the same memory channel. For example, for two memory channels connecting eight DIMM connectors using through-hole DIMM connectors, the daisy chain topology may require four to five layers. The Tee topology may require five to six layers, whereas the Star topology may require at least six layers, thus increasing the cost of the PCB for these topology placements.

In some cases with high frequencies, the Star topology may require that unpopulated DIMM sockets be terminated in order to maintain the bus electrical balanced.

The palm tree topology is so named because the SMT DIMM connector placement resembles branches of a palm tree looking from the side. The palm tree topology's back-to-back SMT DIMM connector placement uses the simplest daisy chain trace routing to reduce the trace length and trace capacitance in a large memory footprint.

Figure 4:
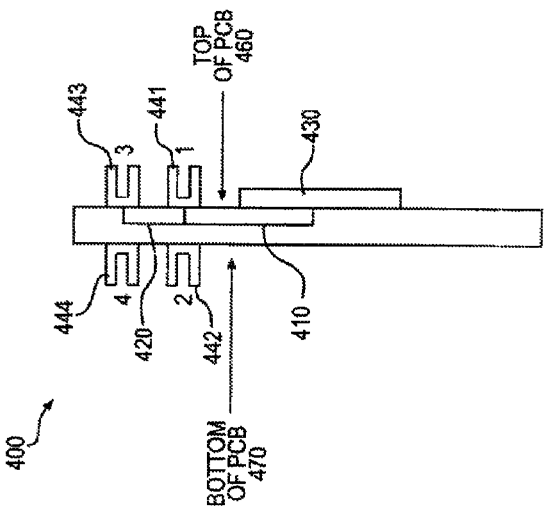
FIG. 4 illustrates an exemplary palm tree topology placement for a four-DIMM per memory channel configuration that utilizes an exemplary system for reducing trace length and capacitance in a large memory footprint.

FIG. 4 illustrates an exemplary palm tree topology 400 placement for a four-DIMM per memory channel configuration that utilizes an exemplary system for reducing trace length and capacitance in a large memory footprint. Two DIMM connectors are placed on the top side of the PCB and two DIMM connectors are placed on the bottom side of the PCB in a mirror fashion. Specifically, $DIMM_1$ 441 and $DIMM_3$ 443 are placed, for example, on the top side of the PCB 460 and $DIMM_2$ 442 and $DIMM_4$ 444 are placed, for example, on the bottom side of the PCB 470. In the exemplary palm tree topology 400 placement, a trace routing, i.e., connection 410, connects a multi-core socket 430 with $DIMM_1$ 441. Another connection 420 connects $DIMM_1$ 441 with $DIMM_3$ 443. No additional long connection is needed because $DIMM_2$ 442 share vias by connecting trace routings with $DIMM_1$ 441, and $DIMM_4$ 444 share vias by connecting trace routings with $DIMM_3$ 443. As a result, the memory footprint of the four-DIMM load may be reduced by, for example, fifty percent (50%).

Figure 5:
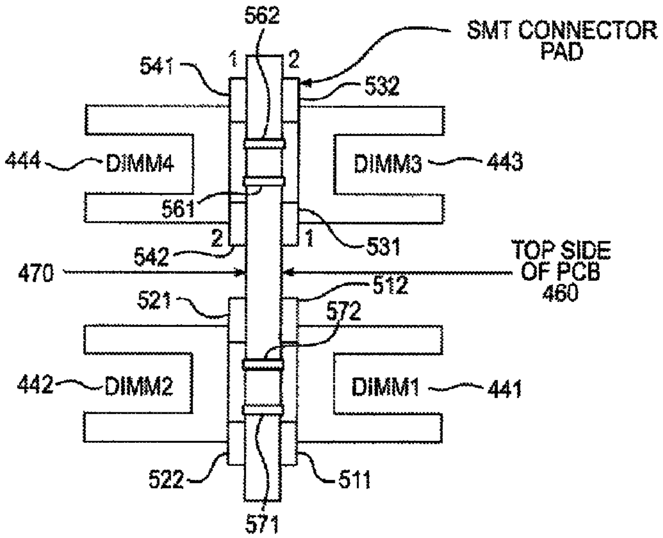
FIGS. 5 and 6 are enlarged views of the DIMM connectors of the exemplary palm tree topology placement of FIG. 4.
Figure 6:
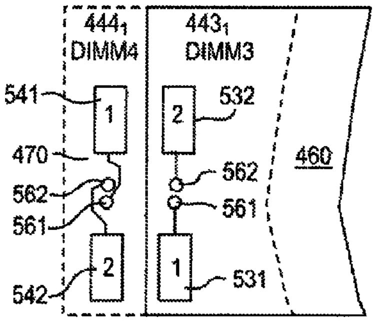

FIGS. 5 and 6 are enlarged views of the DIMM connectors of the exemplary palm tree topology 400 placement of FIG. 4. Referring to FIG. 5, $DIMM_3$ 443, which is located on the top side of the PCB 460, has two SMT connector pads, $pad_2$ 532 and $pad_1$ 531. A via 562 is connected to $pad_2$ 532 using a trace, and a via 561 is connected to $pad_1$ 531 using a trace. $Pad_1$ 541 of $DIMM_4$ 444 is located on the bottom side of the PCB 470 on the opposite side of $pad_2$ 532 of $DIMM_3$ 443. Similarly, $pad_2$ 542 of $DIMM_4$ 444 is located on the bottom side of the PCB 470 on the opposite side of $pad_1$ 531 of $DIMM_3$ 443.

With continued reference to FIG. 5, $DIMM_1$ 441, which is located on the top side of the PCB 460, has two SMT connector pads, $pad_2$ 512 and $pad_1$ 511. A via 572 is connected to $pad_2$ 512, and a via 571 is connected to $pad_1$ 511.

Referring to FIG. 6, the pads 532, 531 of $DIMM_3$ 443 are separated to show how the vias 562, 561 are connected on the top side of the PCB 460 and on the bottom side of the PCB 470. A common signal connects $pad_1$ 541 of DIMM 444 and $pad_1$ 531 of DIMM 443. Similarly, a common signal connects $pad_2$ 542 of DIMM 444 and $pad_2$ 532 of DIMM 443. Traces to the vias 562, 561 for $pad_2$ 532 and $pad_1$ 531, respectively, of $DIMM_3$ 443 are routed on the top side of the PCB 460. $Pad_1$ 541 of $DIMM_4$ 444 has a trace routed on the bottom side of the PCB 470 to via 561 to connect to $pad_1$ 531 of $DIMM_3$ 443. Similarly, $pin_2$ of $DIMM_4$ 444 has a trace routed on the bottom side of the PCB 470 to via 562 to connect to $pad_2$ 532 of $DIMM_3$ 443. As a result, $DIMM_4$ 444 (located on the bottom side of the PCB) share vias with $DIMM_3$ 443 (located on the top side of the PCB) for common signals using the exemplary palm tree topology 400 placement. In a similar fashion, $DIMM_2$ 442 and $DIMM_1$ 441 (located on the bottom side and top side of the PCB, respectively) share vias for common signals.

As illustrated in FIGS. 4, 5, and 6, with the exemplary palm tree topology 400 placement, two DIMM connectors of the same channel are placed on each side of the PCB. Therefore, the trace length connecting the two SMT DIMM connectors may be shortened because the SMT DIMM connectors share vias and use mirror placement. For example, with a traditional topology placement in which four DIMM connectors are stacked on the same side of the PCB (i.e., stacked DIMM placement), a trace connecting a common signal from pin x of the first DIMM to each of the same pin x of the second, third, and fourth DIMM may be 1.2 inches long. However, when two DIMM connectors are placed on the top side of the PCB and two DIMM connectors are placed on the bottom side of the PCB, the same signal trace connecting the four DIMM connectors can be less than 600 mils long.

As also shown in FIGS. 5 and 6, with the exemplary palm tree topology 400 placement, since the SMT connector pads of the two SMT DIMM connectors are mirrored on either side of the PCB, the SMT connector pads may be close to each other. Consequently, for the SMT connector pads that share a common signal, one via, e.g., 562, can be placed between the SMT connector pads, e.g., 532 and 542, for connection on the top side of the PCB and on the bottom side of the PCB, as shown in FIGS. 5 and 6. Since the SMT connector pads are mirrored and connected using one via, the trace length may therefore be significantly shortened and the trace capacitance may be reduced. For four DIMM connectors, only two vias, e.g., 562, 561, may be needed using the exemplary palm tree topology 400 placement, whereas four vias are needed using a traditional topology placement in which DIMM connectors are stacked on the same side of the PCB (one via per DIMM connector), whether these connectors are through-hole DIMM connectors or SMT DIMM connectors. Thus, the exemplary palm tree topology 400 may significantly reduce the number of vias, i.e., via count, when compared to traditional topology placements, such as the daisy chain, Tee, and Star topology placements.

A few control signals may not be shared with the same via since the control signals may be unique to each individual DIMM. However, the sharing of vias between the top and bottom DIMM connectors with the exemplary palm tee topology 400 placement may decrease the overall via count, thus significantly reducing the loading effect. For example, as noted above, with the exemplary palm tree topology 400 placement, a four-DIMM connector placement may need half the number of vias for commonly shared signals when compared to a traditional topology placement. As a result, with the DDR2 memory, 667 MHZ may be the top speed achieved for a four-DIMM per channel placement using the Tee topology placement; and 533 MHZ using the daisy chain topology placement. At 800 MHZ, only two DIMM connectors per channel can operate using the daisy chain topology placement. However, using the exemplary palm tree topology 400 placement, simulation shows that the speed of 800 MHZ can easily be achieved with four DIMM connectors.

As also shown in FIGS. 4, 5, and 6, the system and method may effectively reduce trace routing, i.e., memory footprint, by, for example, fifty percent (50%) compared to a traditional topology placement in which all DIMM connectors are stacked on one side of the PCB. The total trace length may be reduced. For example, an eight DIMM placement connected to two channels (four DIMM connectors per channel) with a 375 mils DIMM-to-DIMM spacing traditionally has a trace length of 2.90 inches from the edge of the first DIMM connector to the edge of the last DIMM connector. By contrast, using the exemplary palm tree topology 400 placement by placing SMT DIMM connectors on both the top and bottom sides of the PCB, the trace length may be reduced to 1.45 inches, which is the equivalent trace length of a four DIMM placement if the DIMM connectors are placed on the same side of the PCB.

Reducing the trace length and the number of vias may significantly reduce the trace capacitance. The memory channel may be populated with more DIMM connectors operating at high frequencies when compared to the traditional topology placement in which the DIMM connectors are stacked on the same side of the PCB, such as the Tee or Star topology. For example, four Double Data Rate 2 (DDR2) DIMM connectors per channel may not operate at 800 MHZ with the Tee or Star topology placement, but can operate with the exemplary palm tree topology 400 placement. To operate at 800 MHZ with the Tee or Star topology placement, some number of the DIMM connectors may need to be depopulated. As a result, the highest frequencies are only achieved with a lightly loaded memory bus. Populating more DIMM connectors means running the memory bus at a lower frequency with the Tee or Star topology placement.

As the DDR memory technology advances, the frequency increases and voltages decrease. Meeting the bus timing requirements may be more difficult with a heavily loaded bus, because as more DIMM connectors are used per memory channel, the trace capacitance increases, thus affecting timing parameters, such as the rise time. When the trace length is reduced by half, for example, using the exemplary palm tree topology 400 placement, signal propagation timing may be improved. The bus operating frequency may improve as well.

As bus frequencies get higher, especially with the double-data-rate three (DDR3) memory technology, the daisy chain topology can only be used in a stacked DIMM placement with a lightly loaded bus. At high frequencies, keeping trace lengths short and balanced to each DIMM connector is an important requirement, which may be achieved by either the Tee or Star topology placement that inevitably increases the number of layers, i.e., layer count, as noted above with respect to FIGS. 2 and 3. Indeed, both the Tee and Star topology placements require that the same signal trace to each DIMM connector of the same channel be routed in a star fashion fanning out of a common via, which results in the increased number of layers. The exemplary palm tree topology 400 placement already places DIMM connectors of the same channel as close as possible. As shown in FIG. 4, only two layers are needed to complete the connections of four DIMM connectors, i.e., connection 410 and connection 420. Therefore, the exemplary palm tree topology 400 placement offers a reduction in layer count compared to the Tee and Star topology placements.

With the DDR3 memory technology, the exemplary palm tree topology 400 placement may allow more DIMM connectors to operate at high frequencies when compared to other topology placements. For example, the DDR3 speeds are anticipated to run at 1600 MHZ by 2010. At that speed using the traditional topology placement, only one load (i.e., one DIMM) per channel is projected to work by simulation results. For 1066 MHZ, only three loads are projected to work using the Star topology placement.

Furthermore, the DDR3 memory technology is also projected to work at lower voltages (such as 1.5V currently, 1.35V by 2010, and 1.2V by 2012), which makes the adverse effects of long traces and high trace capacitance more pronounced at high frequencies. Being able to operate more DIMM connectors at high frequencies using the exemplary palm tree topology 400 placement may achieve better system performance.

Figure 7:
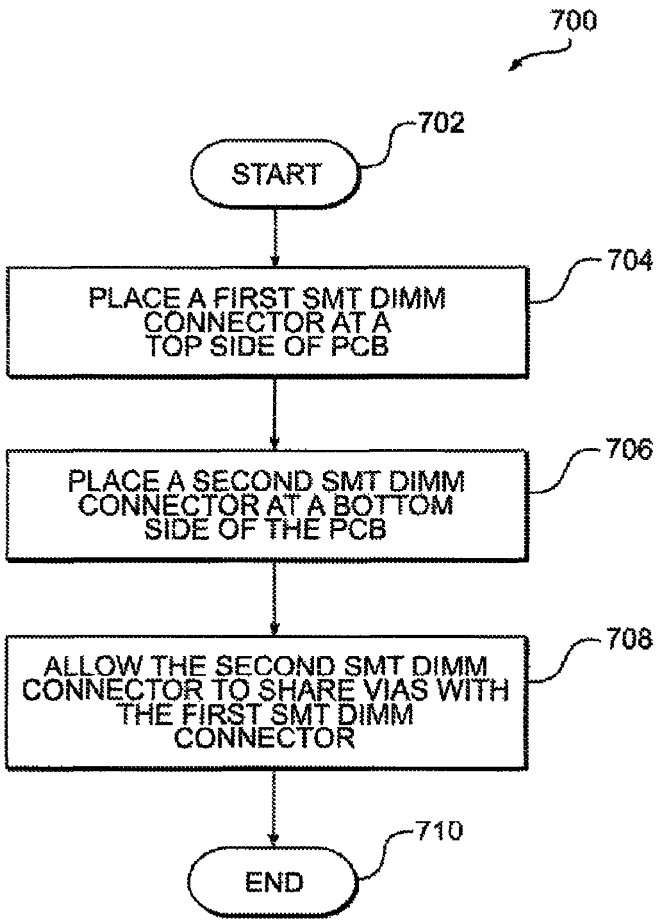
FIG. 7 is a flow chart illustrating an exemplary method for reducing trace length and capacitance in a large memory footprint.

FIG. 7 is a flow chart illustrating an exemplary method 700 for reducing trace length and capacitance in a large memory footprint. The method 700 starts at 702 and ends at 710. The method 700 includes placing a first SMT DIMM connector on the top side of a PCB (block 704), placing a second SMT DIMM connector on the bottom side of the PCB (block 706), and allowing the second SMT DIMM connector to share vias with the first SMT DIMM connector (block 708).

In the foregoing detailed description, systems and methods in accordance with embodiments of the method and system for reducing trace length and capacitance in a large memory footprint are described with reference to specific exemplary embodiments. Accordingly, the present specification and figures are to be regarded as illustrative rather than restrictive. The scope of the method and system for reducing trace length and capacitance in a large memory footprint is to be further understood by the numbered examples appended hereto, and by their equivalents.

Further, in describing various embodiments, the specification may present a method and/or process as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process should not be limited to the performance of their steps in the order written, and one skilled in the art can readily appreciate that the sequences may be varied and still remain within the spirit and scope of the various embodiments.

What is claimed is:

1. A printed circuit board (PCB) assembly, comprising:

a PCB having a top side and a bottom side;

a first surface mount technology (SMT) dual in-line memory module (DIMM) connector placed on the top side of the PCB;

a second SMT DIMM connector placed on the bottom side of the PCB; and wherein the first SMT DIMM connector comprises a first SMT connector pad and a second SMT connector pad, the first SMT connector pad of the first SMT DIMM connector being connected to a first via and the second SMT connector pad of the first SMT DIMM connector being connected to a second via and wherein the second SMT DIMM connector comprises a first SMT connector pad and a second SMT connector pad, the first SMT connector pad of the second SMT DIMM connector being connected to the first SMT connector pad of the first SMT DIMM connector through the first via and the second SMT connector pad of the second SMT DIMM connector being connected to the second SMT connector pad of the first SMT DIMM connector through the second via and wherein the second SMT connector pad of the first SMT DIMM connector is located on the top side of the PCB, and wherein the first SMT connector pad of the second SMT DIMM connector is located on the bottom side of the PCB on an opposite side of the second SMT connector pad of the first SMT DIMM connector.

2. The PCB assembly of claim 1, wherein the first SMT DIMM connector and the second SMT DIMM connector are placed on the PCB in a mirror fashion.

3. The PCB assembly of cairn 1, wherein the PCB includes four DIMM connectors per memory channel, and wherein two of the four DIMM connectors are placed on the top side of the PCB and another two of the four DIMM connectors are placed on the bottom side of the PCB.

4. The PCB assembly of claim 1, wherein the first SMT DIMM connector and the second SMT DIMM connector are placed on the PCB using a palm tree topology placement.

5. The PCB assembly of claim 1, wherein the first SMT DIMM connector and the second SMT DIMM connector are placed on the PCB using a back-to-back placement.

6. A method for reducing trace length and capacitance in a large memory footprint, comprising:

placing a first surface mount technology (SMT) dual in-line memory module (DIMM) connector on a top side of a printed circuit board (PCB);

placing a second SMT DIMM connector on a bottom side of the PCB; and wherein the first SMT DIMM connector comprises a first SMT connector pad and a second SMT connector pad, allowing the first SMT connector pad of the first SMT DIMM connector to be connected to a first via and the second SMT connector pad of the first SMT DIMM connector being connected to a second via, and wherein the second SMT DIMM connector comprises a first SMT connector pad and a second SMT connector pad, the first SMT connector pad of the second SMT DIMM connector being connected to the first SMT connector pad of the first SMT DIMM connector through the first via and the second SMT connector pad of the second SMT DIMM connector being connected to the second SMT connector pad of the first SMT DIMM connector through the second via and wherein the second SMT connector pad of the first SMT DIMM connector is located on the top side of the PCB, and wherein the first SMT connector pad of the second SMT DIMM connector is located on the bottom side of the PCB on an opposite side of the second SMT connector pad of the first SMT DIMM connector.

7. The method of claim 6, wherein the first SMT DIMM connector and the second SMT DIMM connector are placed on the PCB in a mirror fashion.

8. The method of claim 6, wherein PCB includes four DIMM connectors per memory channel, and wherein two of the four DIMM connectors are placed on the top side of the PCB and another two of the four DIMM connectors are placed on the bottom side of the PCB.

9. The method of claim 6, wherein the first SMT DIMM connector and the second SMT DIMM connector are placed on the PCB using a palm tree topology placement.

10. A system for reducing trace length and capacitance in a large memory footprint, comprising:

means for placing a first surface mount technology (SMT) dual in-line memory module (DIMM) connector on a top side of a printed circuit board (PCB);

mean for placing a second SMT DIMM connector on a bottom side of the PCB; and wherein the first SMT DIMM connector comprises a first SMT connector pad and a second SMT connector pad, allowing the first SMT connector pad of the first SMT DIMM connector to be connected to a first via and the second SMT connector pad of the first SMT DIMM connector being connected to a second via, and wherein the second SMT DIMM connector comprises a first SMT connector pad and a second SMT connector pad, the first SMT connector pad of the second SMT DIMM connector being connected to the first SMT connector pad of the first SMT DIMM connector through the first via and the second SMT connector pad of the second SMT DIMM connector being connected to the second SMT connector pad of the first SMT DIMM connector through the second via and wherein the second SMT connector pad of the first SMT DIMM connector is located on the top side of the PCB, and wherein the first SMT connector pad of the second SMT DIMM connector is located on the bottom side of the PCB on an opposite side of the second SMT connector pad of the first SMT DIMM connector.

* * * * *

UNITED STATES PATENT AND TRADEMARK OFFICE

CERTIFICATE OF CORRECTION

PATENT NO. : 8,866,023 B2
APPLICATION NO. : 13/265323
DATED : October 21, 2014
INVENTOR(S) : Rachid M. Kadri et al.

It is certified that error appears in the above-identified patent and that said Letters Patent is hereby corrected as shown below:

In the Claims

In column 6, line 41, in Claim 1, delete “via” and insert -- via, --, therefor.

In column 6, line 60, in Claim 3, delete “cairn” and insert -- claim --, therefor.

In column 8, line 14, in Claim 10, before “wherein” insert -- means for --.

Signed and Sealed this
Fourteenth Day of April, 2015

Michelle K. Lee
*Director of the United States Patent and Trademark Office*